United States Patent [19]

Inaba

[11] Patent Number: 5,055,715
[45] Date of Patent: Oct. 8, 1991

[54] SEMICONDUCTOR INTEGRATED CIRCUIT PROVIDED WITH MONITOR-ELEMENTS FOR CHECKING AFFECTION OF PROCESS DEVIATION ON OTHER ELEMENTS

[75] Inventor: Hideo Inaba, Tokyo, Japan

[73] Assignee: NEC Corporation, Tokyo, Japan

[21] Appl. No.: 503,642

[22] Filed: Apr. 3, 1990

[30] Foreign Application Priority Data

Apr. 3, 1989 [JP] Japan .................................... 1-85226

[51] Int. Cl.$^5$ ............................................. G06F 11/22
[52] U.S. Cl. .................................... 307/443; 307/448; 371/22.1; 371/25.1
[58] Field of Search ............... 307/443, 448; 371/25.1, 371/22.1

[56] References Cited

U.S. PATENT DOCUMENTS

| 4,380,070 | 4/1983 | Steiner | 371/25.1 |
| 4,811,344 | 3/1988 | Clauvel et al. | 371/22.1 |

Primary Examiner—Stanley D. Miller
Assistant Examiner—Scott A. Ouellette
Attorney, Agent, or Firm—Sughrue, Mion, Zinn, Macpeak & Seas

[57] ABSTRACT

A semiconductor integrated circuit provided with a monitor arrangement for evaluating functional transistors indirectly is disclosed. The monitor arrangement includes a plurality of monitor transistors having current paths connected in parallel between a pair of terminals and a selection circuit responsive to at least one external control signal for rendering one of the monitor transistors conductive.

5 Claims, 2 Drawing Sheets

SEMICONDUCTOR INTEGRATED CIRCUIT PROVIDED WITH MONITOR-ELEMENTS FOR CHECKING AFFECTION OF PROCESS DEVIATION ON OTHER ELEMENTS

BACKGROUND OF THE INVENTION

1. Field of the Invention

The present invention relates to a semiconductor integrated circuit, and more particularly to a semiconductor integrated circuit having monitor-elements used for monitoring characteristics of functional elements formed in the same integrated circuit.

2. Description of the Related Art:

Integration scale and integration density of integrated circuits have been remarkably enhanced with minimization of or reduction in transistor size. In other words, the reduction in transistor size has brought the increase in the integration scale and the intergration density. However, affection of deviation of manufacturing process to a plurality of transistors has been also adversely increased. For example, a fluctuation or deviation in channel length among transistors having small, reduced sizes, particularly relatively short channel length largely affects electrical characteristics of the transistors such as current flowing capability thereof, and the above fluctuation or deviation in the transistor characteristics is dependent on arrangement of the transistors on the semiconductor substrate.

For example, a transistor which is apart from other transistors has a different characteristics from that of a transistor which is adjacent to other transistors due to the mutual affection therebewteen. Thus, comparative relation of transistor characteristics among transistors are lowerd even when such transistors have been designed to have the same characteristics. For example, a pair of transistors are used as input transistors to form a differential amplifier. However, if there is generated a fluctuation of characteristics between the above pair of transistors through manufacturing process, circuit characteristics of the differential amplifier are largely lowered.

Under the above circumstance, it has been desired to analyze relationship between fluctuation in characteristics of transistors and location of the transistors, and to reflect the analyzed result on designing integrated circuits.

Heretofore, it has been practiced to form a monitor transistor together with functional transistors on the same semiconductor substrate and characteristics of the functional transistors are indirectly checked by measuring the characteristics of the monitor transistor.

However, according to the conventional technique, it is impossible to analyze relative deviation between a plurality of transistors formed adjacently on the same substrate through the monitor transistor. In this connection, it may be conceived to form a plurality of monitor transistors on the same semiconductor substrate. In this case, however, a number of pads coupled to the monitoring transistors for measuring characteristics of the monitor transistors is inevitably increased to occupy a relatively large area on the semiconductor substrate. This would be a large obstacle for improving the integration density and would also be impractical.

SUMMARY OF THE INVENTION

It is an object of the present invention to provide a semiconductor integrated circuit provided with the improved monitoring element arrangement for analyzing distribution of transistor characteristics.

It is another object of the present invention to provide a semiconductor integrated circuit provided with the improved monitoring transistor arrangement formed on a limited area of a semiconductor substrate.

A semiconductor integrated cicrcuit according to the present invention comprises a semiconductor substrate, a functional circuit having a plurality of functional transistors formed on the substrate, first and second terminals, a plurality of monitor transistors formed on the substrate, each of the monitor transistors having a current path and a control electrode for controlling a conductance of the current path thereof, means for connecting the current paths of the monitor transistors between the first and second terminals in parallel, at least one third terminal receiving a control signal, and a selection circuit responsive to the control signal for selectively rendering one of the monitor transistors conductive.

According to the present invention, comparative evaluation among a plurality of functional transistors can be conducted with case by measuring the monitor transistors one by one.

DETAILED DESCRIPTION OF THE DRAWINGS

The above and further objects, features and advantages of the present invention will become more apparent from the following detailed description in conjunction with the accompanying drawings, wherein.

DETAILED DESCRIPTION OF THE INVENTION

Prior Art

Figure 1:
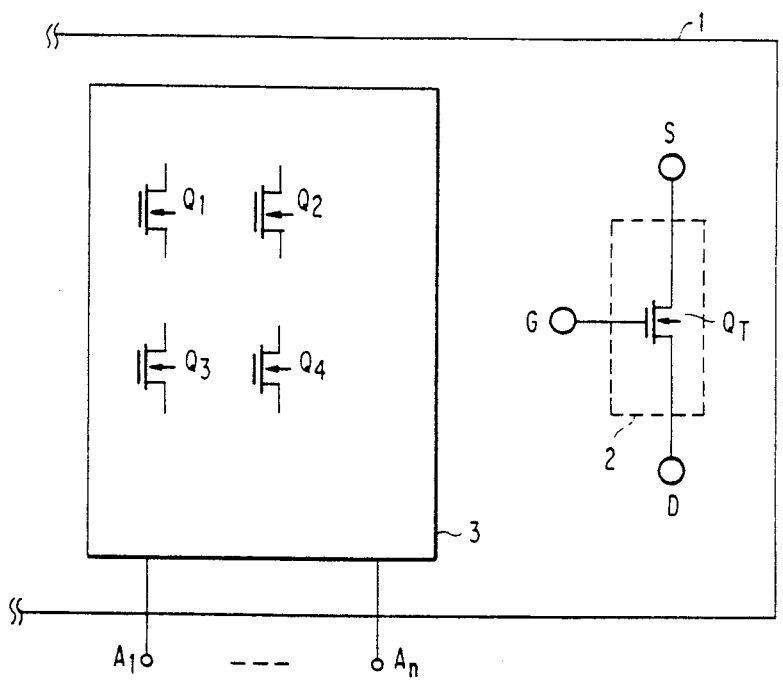
FIG. 1 is a modeling diagram showing a major part of a semiconductor integrated circuit in the prior art.

With reference to FIG. 1, a semiconductor integrated circuit in the prior art will be explained.

The integrated circuit of FIG. 1 includes a functional circuit having a plurality of N-channel MOS field effect transistors $Q_1$–$Q_4$ formed on a semiconductor substrate 1 and connected to a plurality of external terminals $A_1$–$A_n$, and an N-channel monitor MOS field effect transistor $Q_T$ formed on the semiconductor substrate. The monitor transistor $Q_T$ and the transistors $Q_1$–$Q_4$ are formed through the same manufacturing processes. A source pad S, a gate pad G and a drain pad D connected to a source, a gate and a drain of the monitor transistor QT, respectively are formed on the semiconductor substrate 1. The external terminals A1–An are used as input and output terminals to perform signal transmission between the functional circuit 3 and the outside of the substrate 1.

After the formation of the transistors $Q_1$–$Q_4$ and the monitor transistor $Q_T$, characteristics such as an amount of ON-current of the monitor transistor $Q_T$ are measured by contacting probes of a tester to the pads S, G and D. The measuring result of the monitoring transistor thus obtained is used to evaluate characteristics of the transistors $Q_1$–$Q_4$ indirectly. However, it has been sometimes experienced that a transistor located apart from other transistors shows different characteristics from that of a transistor located adjacently to other transistors and location or direction of the transistors affects characteristics of the transistors. Therefore, the measuring result of the monitor transistor is insufficient to evaluate a plurality of transistors formed adjacently.

Embodiment

Figure 2:
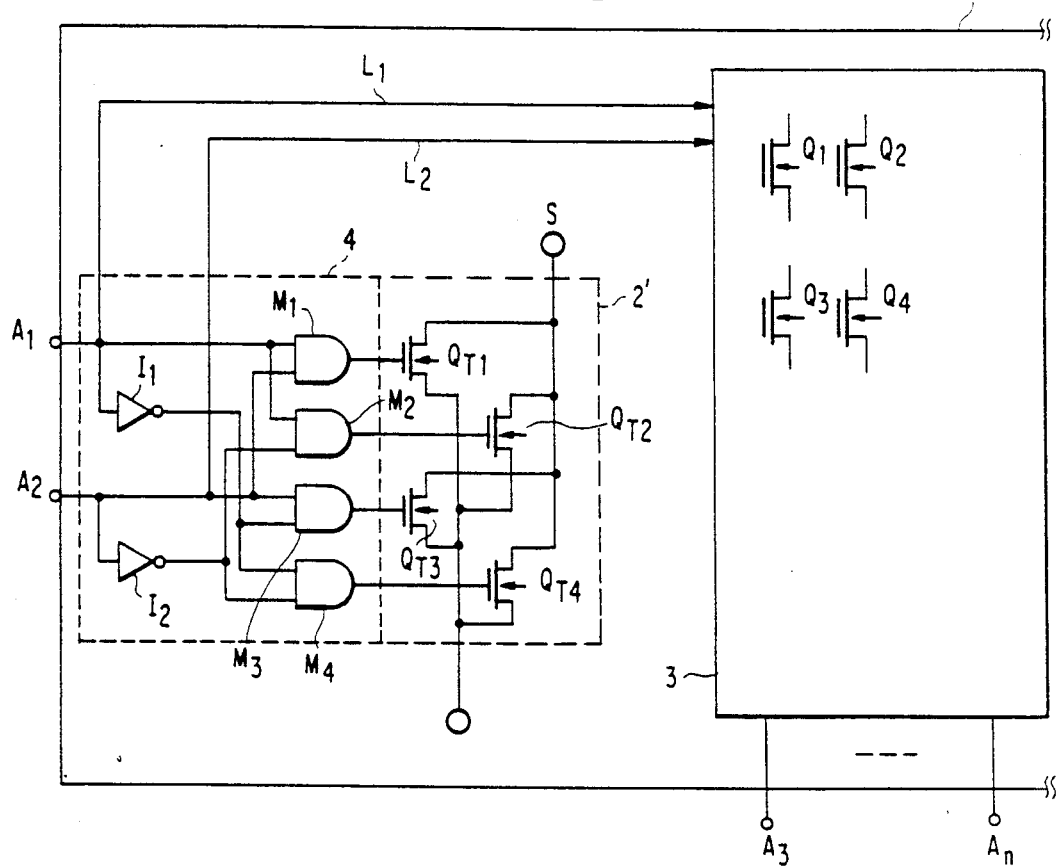
FIG. 2 is a schematic circuit diagram showing a monitor transistor arrangement according to a first embodiment of the present invention.

With reference to FIG. 2, a semiconductor integrated circuit according to a first embodiment will be explained. In the following description, those parts or elements corresponding to those in FIG. 1 are denoted by the same or similar references and detailed explanation therefor will be omitted.

The present embodiment is by providing a monitor transistor arrangement 2' having four N-channel monitor transistors $Q_{T1}$–$Q_{T4}$ having the same size and configuration and a decoder circuit 4 for selecting one of the monitor transistors in response to two external signals applied to the terminals $A_1$ and $A_2$. The remaining external terminals $A_3$–$A_n$, which are input and output terminals, are directly coupled to the functional circuit 3, similarly to the case of FIG. 1. In the arrangement 2', all the sources and all the drains of the monitor transistors $Q_{T1}$–$Q_{T4}$ are commonly connected to the source pad S and the drain pad D, respectively. The decoder circuit 4 includes inverters $I_1$, $I_2$ and AND gates $M_1$–$M_4$. The outputs of the AND gates $M_1$–$M_4$ are applied to gates of the monitor transistors $Q_{T1}$–Qthd T4, respectively. In this arrangement, the terminals $A_1$ and $A_2$ are also coupled to the functional circuit 3 through wirings $L_1$ and $L_2$, respectively.

Relation between the external signals $A_1$ and $A_2$ and the selection of the monitor transistors $Q_{T1}$–$Q_{T4}$ are as follows:

| $A_1$ | $A_2$ | Selected transistor |
|---|---|---|
| 1 | 1 | $Q_{T1}$ |
| 1 | 0 | $Q_{T2}$ |
| 0 | 1 | $Q_{T3}$ |
| 0 | 0 | $Q_{T4}$ |

Accordingly, by setting the contents of the signals $A_1$ and $A_2$, one of the monitor transistors $Q_{T1}$–$Q_{T4}$ is selectively rendered conductivd and an ON-current of the selected monitor transistor can be measured through the pads S and D. Therefore, by changing the contents of the signals $A_1$ and $A_2$, the monitor transistors $Q_{T1}$–$Q_{T4}$ are measured one by one.

Figure 4:
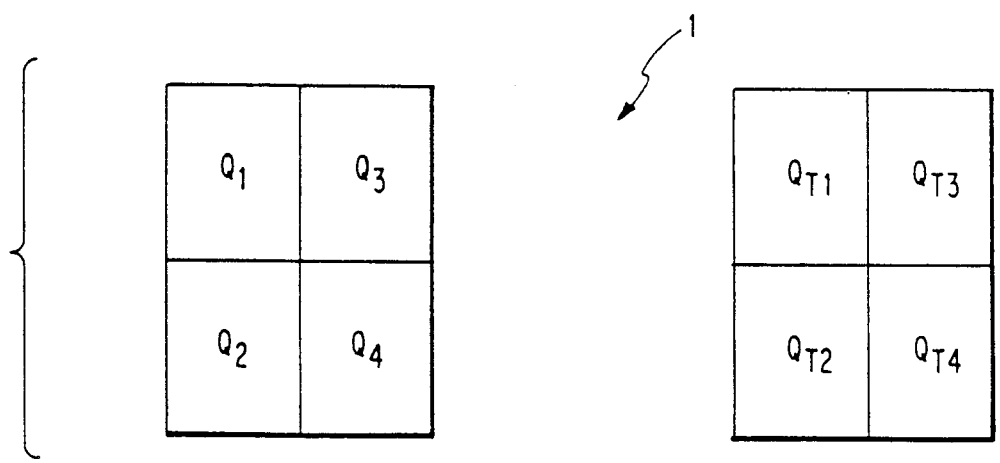
FIG. 4 is a plan view showing arrangements of the transistors in the invention.

In order to effectively evaluate the functional transistors $Q_1$–$Q_4$ of the functional circuit 3, the monitor transistors $Q_{T1}$–$Q_{T4}$ are perferably arranged in the same pattern as that of the functional transistors, as illustrated in FIG. 4. In FIG. 4, the functional transistors $Q_1$–$Q_4$ are formed in a matrix form of 2 rows by 2 columns and the monitor transistors $Q_{T1}$–$Q_{T4}$ are also formed in a matrix form of 2 rows and 2 columns on the substrate.

Figure 3:
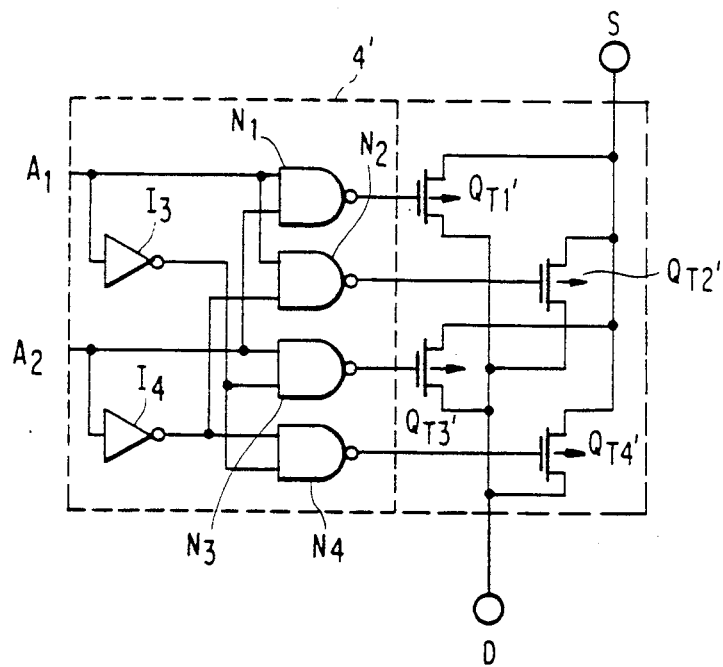
FIG. 3 is a schematic circuit diagram showing a monitor transistor arrangement according to a second embodiment of the present invention.

With reference to FIG. 3, a second embodiment of the present invention will be described.

This embodiment is for the case where the functional circuit 3 includes P-channel transistors. The monitor transistor arrangement 2' includes four P-channel monitor transistors $Q_{T1}'$–$Q_{T4}'$ arranged in a matrix form of 2 rows and 2 columns. The decoder circuit 4' includes NAND circuits $N_1$–$N_4$ for selecting the monitor transistors $Q_{T1}'$–$Q_{T4}'$, respectively.

The relation between the contents of the signals $A_1$ and $A_2$ and the selection of the monitor transistors $Q_{T1}'$–$Q_{T4}'$ is the same as the previous embodiment of FIG. 2.

As has been described above, the comparative relation ship among a plurality of transistors adjacently formed on a semiconductor substrate can be analyzed through a plurality of monitor transistors with ease according to the present invention.

What is claimed is:

1. A semiconductor intergrated circuit comprising a semiconductor substrate, a functional circuit having a plurality of functional transistors formed on said substrate, a first pad formed on said substrate, a second pad formed on said substrate, a plurality of monitor transistors formed on said substrate, each of said monitor transistors having a current path and a control electrode for controlling a conductance of the current path thereof, a circuit connection for connecting the current path of each of said monitor transistors between said first and second pads in parallel, external terminal means receiving a control signal, and a selection circuit responsive to said control signal for selectively rendering one of said monitor transistors conductive, wherein the conductance of one of said monitor transistors selected by said selection circuit is checked by a current flowing through said first and second pads.

2. The semiconductor integrated circuit according to claim 1, in which said functional transistors and said monitor transistors are MOS field effect transistors.

3. The semiconductor integrated circuit according to claim 1, in which said plurality of functional transistors are located adjacently and said plurality of monitor transistors are located adjacently.

4. The semiconductor integrated circuit according to claim 1, in which said monitor transistors are arranged in a matrix form.

5. The semiconductor integrated circuit according to claim 1, further comprising means for connecting said external terminal means to said functional circuit.

* * * * *

UNITED STATES PATENT AND TRADEMARK OFFICE
CERTIFICATE OF CORRECTION

PATENT NO. : 5,055,715

DATED : October 8, 1991

INVENTOR(S) : Hideo INABA

It is certified that error appears in the above-identified patent and that said Letters Patent is hereby corrected as shown below:

Col. 3, line 32, delete "Qthd $T_4$" and insert --$Q_{T4}$--.

Signed and Sealed this

Twenty-seventh Day of April, 1993

Attest:

MICHAEL K. KIRK

Attesting Officer     Acting Commissioner of Patents and Trademarks